United States Patent
Cassel et al.

(10) Patent No.: US 6,555,242 B2
(45) Date of Patent: Apr. 29, 2003

(54) LONGITUDINALLY STRETCHED, VACUUM VAPOR COATED PACKAGING FILMS

(75) Inventors: Antoine Cassel, Walsrode (DE); Rainer Brandt, Walsrode (DE); Gregor Kaschel, Bomlitz (DE)

(73) Assignee: Wolff Walsrode AG, Walsrode (DE)

( * ) Notice: Subject to any disclaimer, the term of this patent is extended or adjusted under 35 U.S.C. 154(b) by 0 days.

(21) Appl. No.: 09/768,669

(22) Filed: Jan. 24, 2001

(65) Prior Publication Data

US 2001/0014400 A1 Aug. 16, 2001

(30) Foreign Application Priority Data

Feb. 4, 2000 (DE) .......................................... 100 05 038

(51) Int. Cl.$^7$ .......................... B32B 27/08; B32B 15/08
(52) U.S. Cl. ................................ 428/474.4; 428/411.1; 428/35.7; 428/35.8; 428/35.9; 428/36.7; 428/36.91; 428/458; 428/474.4; 428/475.8
(58) Field of Search .......................... 428/474.4, 411.1, 428/458, 475.8, 35.7, 35.8, 35.9, 36.7, 36.91

(56) References Cited

U.S. PATENT DOCUMENTS

| | | | | |
|---|---|---|---|---|
| 4,559,266 A | | 12/1985 | Misasa et al. ............... 428/341 |
| 4,755,419 A | * | 7/1988 | Shah ........................... 428/220 |
| 5,021,298 A | | 6/1991 | Revell ......................... 428/458 |
| 5,096,630 A | * | 3/1992 | Bothe et al. .................. 264/22 |
| 5,153,074 A | | 10/1992 | Migliorini .................... 428/463 |
| 6,165,571 A | | 12/2000 | Lykke ......................... 428/35.8 |
| 6,274,246 B1 | * | 8/2001 | Eggers et al. ............. 428/474.4 |

FOREIGN PATENT DOCUMENTS

| | | | | |
|---|---|---|---|---|
| EP | 0 096 581 | | 12/1983 | ........... B32B/27/08 |
| EP | 0 302 813 | | 2/1989 | ........... B05D/1/32 |
| EP | 0 686 500 | | 12/1995 | ........... B32B/27/32 |
| EP | 0 806448 A2 | * | 11/1997 | |
| WO | WO 97/38853 | | 10/1997 | ........... B32B/27/08 |

* cited by examiner

Primary Examiner—P. Hampton-Hightower
(74) Attorney, Agent, or Firm—Norris McLaughlin & Marcus

(57) ABSTRACT

A longitudinally stretched multilayered film having good barrier properties is described. The film is prepared by a process comprising (a) preparing by coextrusion a laminate structured of, in sequence, a first polyamide layer, an EVOH layer, and a second polyamide layer, and (b) longitudinally stretching the laminate and (c) applying by vacuum vapor deposition to one of the surfaces of the stretched laminate an inorganic layer.

8 Claims, No Drawings

LONGITUDINALLY STRETCHED, VACUUM VAPOR COATED PACKAGING FILMS

The present invention relates to longitudinally stretched, vacuum vapour coated films which are used in the industrial films sector, food packaging and other applications.

It is already known that vacuum vapour coating, for example with inorganic oxides, improves not only the optical properties but also the water vapour and gas barrier properties of a film. In many cases, the oxygen permeability of a film is reduced by a vapour coated organic and/or inorganic layer. An organic barrier layer is mainly introduced by coextrusion, by lamination or by coating. An inorganic layer is usually a metal layer and is applied either as a foil or by vacuum vapour deposition. In many cases, on economic grounds, an organic layer is laminated or coextruded and an inorganic layer is vacuum vapour coated.

U.S. Pat. No. 5,153,074 thus describes a composite film with a layer of modified maleic anhydride/polypropylene (homopolymer or copolymer). Coextrusion (or lamination) proceeds with an ethylene vinyl alcohol (EVOH) layer. The film is then vacuum vapour coated on the EVOH side. The film is biaxially stretched during the process. The film may be coextruded with this structure and the vacuum vapour coating is performed on the EVOH layer, so improving gas permeability properties.

EP-A-0 340 910 describes a similar packaging film. An oriented polyolefin film (or regenerated cellulose film) is coated with a resin polyester or nitrocellulose). This coating, combined with a vacuum vapour coated metal or metal oxide, improves gas or oxygen permeability properties.

EP-A-0 096 581 describes a composite film obtained from two laminated films. A film having an external polyolefin layer and an EVOH, PA or polyethylene terephthalate PET, layer is coextruded. This film is laminated by means of an adhesive to a thermoplastic film (PA, polymethyl methacrylate PMMA, polyethylene PE, polypropylene, PP, PS, PC, PVC, PVdC, EVOH) which has been vacuum vapour coated with metal or metal oxide. In practice, the vapour coated side is laminated against the inner layer of the first film. As a result, elevated gas or oxygen barrier properties combined with relatively good mechanical properties are obtained.

WO 97/38853 discloses a composite film, wherein the outer layer comprises transparent plastic materials (PA, PET or polyolefins), the heat sealing layer comprises polyolefin (PE or PP) and the interlayer comprises a vacuum vapour coated EVOH. These layers are individually extruded or coextruded and then coated or laminated together with primer or adhesive. It should be noted that it was the vapour coated side of the heat sealing layer which was laminated. The entire film may possibly be stretched. Gas or oxygen barrier properties are improved with such a structure and this embodiment.

However, all these known multilayer films have their limitations if the combination of
  enhanced gas barrier properties
  good mechanical properties with good flex crack resistance
  extrudability and good film quality and
  economic viability of the process
is required.

The films of U.S. Pat. No. 5,153,074 achieve good gas such as oxygen barrier properties thanks to the EVOH layer, vapour coating with metals or metal oxides and possibly stretching, but these films have inadequate mechanical properties for many applications because polypropylene is used as the base material.

A good gas barrier is achieved for the films of EP-A-0 340 910 by the vacuum vapour deposition of metal or metal oxide. Mechanical properties, however, are lacking since the base material is polyolefin. Moreover, the film contains no organic gas such as oxygen barrier material, such that the film loses its barrier properties in the event of delamination of the vapour coated layer.

The films of EP-A-0 096 581 exhibit good gas barrier properties, but these films are produced from two laminated films. These films are separately extruded, which makes the process more costly than a single stage process, such as for example coextrusion. Moreover, the film is not stretched, which would in general improve gas or vapour barrier properties and mechanical properties.

Good gas barrier properties are achieved with the films disclosed in WO 97/38853 by the EVOH layer, vacuum vapour coating and possibly stretching, but mechanical properties often prove inadequate. To this end, the layers should be individually extruded, which has a negative effect, for example, on the EVOH layer (fish eyes may form). It is known that extruding EVOH is difficult if the EVOH melt has direct contact with the metal walls of the die. A laminated composite is thus also difficult to stretch, so hindering any improvement of properties (gas or oxygen permeability and mechanical properties).

The object accordingly arose of providing a vacuum vapour coated, stretched, coextrudable multilayer film with very high gas barrier properties which exhibits improved mechanical properties. The vapour coated layer of the film should be delaminable and have elevated gas or oxygen barrier properties in the delaminable areas.

This object has been achieved according to the invention by providing a longitudinally stretched, vacuum vapour coated, multilayer film consisting of a gas barrier layer interposed between at least two polyamide layers wherein the gas barrier layer consists of EVOH with an ethylene content of 25 to 50 mol %, relative to the total moles of EVOH, wherein one or more elements of main groups or subgroups 3 and 4 of the periodic system of elements or the oxides thereof have been vacuum vapour coated onto one external side of the film.

The present invention accordingly provides a longitudinally stretched, vacuum vapour coated multilayer film comprising a gas barrier layer interposed between at least two polyamide layers consisting of
1. a gas barrier layer of EVOH having an ethylene content of 25 to 50 mol % and a layer thickness of between 0.5 and 10 $\mu$m preferably between 1 and 5 $\mu$m,
2. at least two polyamide layers, each having a thickness of between 3 and 25 $\mu$m, wherein
the film has been subjected to longitudinal stretching with a stretching ratio of approx. 1.5:1 to 8:1 and a layer of one or more elements from the group of main groups and subgroups 3 and 4 of the periodic system of elements or the oxides thereof is vacuum vapour coated onto the external side of one polyamide layer.

The barrier layer is interposed between two polyamide layers by coextrusion. The thickness of each of the polyamide layers, independently one of the other, is between 3 and 25 $\mu$m, preferably between 5 and 10 $\mu$m.

The vacuum vapour coated layer is a metal or non-metal oxide layer from the group of elements of main groups and subgroups 3 and 4 of the periodic system of elements and the oxides thereof, preferably a vacuum vapour coated aluminium layer, having an optical density of approx. 1.5 to 3.5. This layer is vapour coated onto an external layer. Longitudinal stretching proceeds with a stretching ratio of approx. 1.5:1 to 8:1, preferably of approx. 2:1 to 5:1.

This vacuum vapour coated layer is chemically removable, such that letters, diamond-shaped patterns and viewing windows may be incorporated into this layer with a printing press.

After this process, this film may be further processed. For example, a heat sealing layer may be laminated or coated onto the vapour coated side. Applying this layer improves the barrier properties of the resulting composite, because abrasion on the vapour coated surface is minimized and because this vapour coated layer is located closer to the neutral core of the film on kinking. This layer thus undergoes less damage by kinking and barrier action is improved.

The invented laminate is suitable as packaging material due to its good oxygen barrier properties. It has been found that vacuum vapour coating in accordance with the invention, together with longitudinal stretching, surprisingly considerably further improves this barrier action.

Thanks to the use of this combination (vacuum vapour coated, stretched film with the structure PA/EVOH/PA), it has proved possible to produce films which exhibit particularly good oxygen or also helium barrier properties, which also exhibit very good flex crack resistance. Also, due to their structure, the laminates may be extruded (excellent film quality without fish eyes and with excellent optical properties) and stretched resulting in more stability by longitudinal stretching (elevated strength with slight elongation). This stability enables ready processability on printing and laminating machinery.

The film according to the invention is conveniently produced by flat film coextrusion.

The plastics (as pellets) are plasticised and melted by means of extruders. The melt is then shaped in the die to yield a thin, multilayered film. After leaving the die, this film is deposited on a casting roll and then on a chill roll, which draw off and simultaneously cool the film.

The film is then reheated in a stretching zone and simultaneously drawn longitudinally, to enable longitudinal stretching. Once stretched, the film may be wound onto reels.

The finished film is vapour coated under a vacuum. The vacuum vapor deposition is a method that is well known in the art.

The oxygen and helium permeabilities of the invented films are measured according to DIN standard 53380, while optical density is measured with a model DN 500 Dainippon instrument.

The invention is further illustrated but is not intended to be limited by the following examples in which all parts and percentages are by weight unless otherwise specified.

EXAMPLES

Comparative Example 1

A film with the structure polyamide, thickness 6 μm/ethylene vinyl alcohol, thickness 3 μm/polyamide, thickness 6 μm (composite film=15 μm) is coextruded. This film exhibits oxygen permeability of approx. 2 $cm^3/m^2 \cdot day \cdot bar$ (at 23° C., 0% humidity).

Comparative Example 2

A similar film with the structure polyamide, thickness 6 μm/ethylene vinyl alcohol, thickness 3 μm/polyamide, thickness 6 μm (composite film=15 μm) is coextruded and longitudinally stretched. Oxygen permeability is approx. 1.5 $cm^3/m^2 \cdot day \cdot bar$ (at 23° C., 0% humidity), a value which demonstrates the influence of longitudinal stretching on oxygen permeability. Helium permeability is approx. 0.5 $cm^3/m^2 \cdot day \cdot bar$ (at 23° C., 0% humidity), which is itself an excellent value.

Example 1

The same longitudinally stretched film as in Comparative Example 2 with the structure polyamide, thickness 6 μm/ethylene vinyl alcohol, thickness 3 μm/polyamide, thickness 6 μm (composite film=15 μm) was vacuum coated with aluminium (optical density=2.1). Oxygen permeability is then approx. 0.3 $cm^3/m^2 \cdot day \cdot bar$ and helium permeability approx. 0.01 $cm^3/m^2 \cdot day \cdot bar$ (at 23° C., 0% humidity), which corresponds to a considerable improvement relative to the non-metallised film.

|  | Oxygen permeability 23° C., 0% humidity $cm^3/m^2 \cdot day \cdot bar$ | Helium permeability 23° C., 0% humidity $cm^3/m^2 \cdot day \cdot bar$ |
| --- | --- | --- |
| Comparative Example 1 | 2 | — |
| Comparative Example 2 | 1.5 | 0.5 |
| Example 1 | 0.3 | 0.01 |

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A longitudinally stretched multilayered film prepared by a process comprising
   (a) preparing by coextrusion a laminate structured of, in sequence, a first polyamide layer, an EVOH layer, and a second polyamide layer, and
   (b) longitudinally stretching the laminate prepared in (a) at a stretching ratio of 1.5:1 to 8:1, to produce a stretched laminate and
   (c) applying by vacuum vapor deposition to one of the polyamide layers of said stretched laminate an inorganic layer that contains one or more members selected group consisting of elements of main groups 3 and 4 and subgroups 3 and 4 of the periodic system of elements and oxides of said elements,
   said EVOH layer having a thickness of 0.5 to 10 microns and ethylene content of 25 to 50% relative to the mols of EVOH, said first polyamide layer and said second polyamide layer each independent of the other having a thickness of 3 to 25 microns.

2. The film of claim 1 wherein said member is selected from the group consisting of the elements B, Al, Ti, Si, and their oxides.

3. The film according to claim 2 wherein the inorganic layer consists of aluminium and has an optical density of 1.5 to 3.5.

4. The film according to claim 1 wherein the EVOH layer has a thickness of 1 to 5 microns.

5. The film according to claim 1 wherein said first polyamide layer and second polyamide layer, each have a thickness of 5 to 10 microns.

6. The longitudinally stretched multilayered film of claim 1 which is prepared by a process consisting of:
   (a) preparing by coextrusion a laminate structured of, in sequence, a first polyamide layer, a gas barrier layer, and a second polyamide layer, and
   (b) longitudinally stretching the laminate prepared in (a) at a stretching ratio of 2:1 to 5:1, to produce a stretched laminate and (c) applying by vacuum vapor deposition to one of the surfaces of said stretched laminate an inorganic layer that contains one or more members selected from the group consisting of elements of main groups 3 and 4 and subgroups 3 and 4 of the periodic system of elements and oxides of said elements, wherein, said gas barrier layer is an EVOH layer having a thickness of 1 to 5 microns and ethylene content of 25 to 50% relative to the mols of EVOH, and said first polyamide layer and said second polyamide layer each independent of the other having a thickness of 5 to 10 microns.

7. A longitudinally stretched multilayered film prepared by a process consisting essentially of:

(a) preparing by coextrusion a laminate structured of, in sequence, a first polyamide layer, a gas barrier layer, and a second polyamide layer, and (b) longitudinally stretching the laminate prepared in (a) at a stretching ratio of 2:1 to 5:1, to produce a stretched laminate and (c) applying by vacuum vapor deposition to one of the surfaces of said stretched laminate an inorganic layer that contains one or more members selected from the group consisting of elements of main groups 3 and 4 and subgroups 3 and 4 of the periodic system of elements and oxides of said elements, wherein, said gas barrier layer is an EVOH layer having a thickness of 1 to 5 microns and ethylene content of 25 to 50% relative to the mols of EVOH, and said first polyamide layer and said second polyamide layer each independent of the other having a thickness of 5 to 10 microns.

8. The film of claim 7 wherein the first and second polyamide layer each have a thickness of 6 microns, the gas barrier layer has a thickness of 3 microns and the inorganic layer is aluminum.

* * * * *